(12) United States Patent
Bergmann et al.

(10) Patent No.: US 6,500,677 B2
(45) Date of Patent: Dec. 31, 2002

(54) METHOD FOR FABRICATING A FERROELECTRIC MEMORY CONFIGURATION

(75) Inventors: Renate Bergmann, München; Christine Dehm, Nürnberg; Thomas Roehr, Aschheim; Georg Braun, München, all of (DE); Heinz Hoenigschmid, East Fishkill, NY (US); Günther Schindler, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/027,106

(22) Filed: Dec. 26, 2001

(65) Prior Publication Data

US 2002/0110935 A1 Aug. 15, 2002

Related U.S. Application Data

(63) Continuation of application No. PCT/DE00/01976, filed on Jun. 20, 2000.

(30) Foreign Application Priority Data

Jun. 25, 1999 (DE) .......................................... 199 29 308

(51) Int. Cl.$^7$ ............................................. H01L 21/00
(52) U.S. Cl. ............................. 438/3; 438/240; 438/241
(58) Field of Search ............................. 438/3, 210, 240, 438/241, 253

(56) References Cited

U.S. PATENT DOCUMENTS 5,604,145 A * 2/1997 Hashizume et al. ........ 438/240
6,190,957 B1 * 2/2001 Mochizuki et al. ............ 438/3
6,319,542 B1 * 11/2001 Summerfelt et al. ........... 438/3

FOREIGN PATENT DOCUMENTS

| DE | 197 24 449 A1 | 12/1997 |
|---|---|---|
| DE | 198 32 994 A1 | 1/2000 |
| EP | 0 516 031 A1 | 12/1992 |
| JP | 10-242410 | * 9/1998 |
| WO | WO 99/14761 | 3/1999 |

OTHER PUBLICATIONS

Copy of Korean Patent Application No. 86107955 (Publication No. 329037) (Samsung Electronics Corporation), cited in a Taiwanese Office Action of Aug. 13, 2001 of the corresponding Taiwanese Patent Application.

"Advanced 0.5$\mu$m FRAM Device Technology with Full Compatibility of Half–Micron CMOS Logic Device" (Yamazaki et al.), IEDM 1997, pp. 613–616.

* cited by examiner

*Primary Examiner*—Chandra Chaudhari
(74) *Attorney, Agent, or Firm*—Laurence A. Greenberg; Werner H. Stemer; Ralph E. Locher

(57) ABSTRACT

The invention provides a method. In a first step of a method for fabricating a ferroelectric memory configuration, there is provided a substrate having a multiplicity of memory cells. Each of the memory cells has at least one select transistor, at least one short-circuit transistor, and at least one ferroelectric capacitor. The transistors are connected in an electrically conductive manner to a first of the electrodes of the ferroelectric capacitor. In the next step, at least one electrically insulating layer is applied. In the next step, at least one contact hole for connecting a second electrode of the ferroelectric capacitors is produced. Next, contact holes for connecting the short-circuit transistors are produced. Next, the contact holes are filled with electrically conductive material. Next, an electrically conductive layer is applied and patterned, so that the second electrodes of the ferroelectric capacitors are each conductively connected to the short-circuit transistors.

20 Claims, 5 Drawing Sheets

METHOD FOR FABRICATING A FERROELECTRIC MEMORY CONFIGURATION

CROSS-REFERENCE TO RELATED APPLICATION

This application is a continuation of copending International Application PCT/DE00/01976, filed Jun. 20, 2000, which designated the United States.

BACKGROUND OF THE INVENTION

Field of the Invention

The present invention relates to a method for fabricating a ferroelectric memory configuration. The present invention relates in particular to a method for fabricating a ferroelectric memory configuration having a memory cell array including a multiplicity of memory cells. Each of the memory cells has at least one select transistor and a storage capacitor and can be activated by word and bit lines.

Ferroelectric memory configurations, as are described, for example, in European Patent Application No. EP 0 516 031 A1, corresponding to U.S. Pat. Nos. 5,495,117 and 5,580, 814, or in Yamaziki et al., IEDM, 1997, pp 613–616, compared to conventional memory configurations, such as for example DRAMs and SRAMs, have the advantage that the stored information is not lost, but rather remains stored, even if the voltage or current supply is interrupted. This nonvolatile nature of ferroelectric memory configurations is based on the fact that, when using ferroelectric materials, the polarization that is applied by an external electric field is substantially retained even after the external electric field has been disconnected.

However, in integrated circuits, minor voltage differences between the electrodes of the ferroelectric storage capacitors that are unintentionally occurring are impossible to prevent. These minor voltage differences often occur as a result of parasitic components. Depending on the polarization of the ferroelectric material of the storage capacitor and depending on the polarity of the voltage differences, the voltage differences reinforce or attenuate the polarization of the ferroelectric material. The voltage differences between the electrodes also can be regarded as spurious pulses. Depending on the number and/or amplitude of the spurious pulses, the stored information is attenuated to a greater or lesser extent. In extreme circumstances, the result may even be an incorrect assessment when the memory configuration is read, which in practice corresponds to the data being lost.

This is to be explained in more detail with reference to FIG. 10, in which the hysteresis curve of a ferroelectric storage capacitor is plotted. This hysteresis curve shows that when a voltage V=0 is present, there are two polarization states P, with the result that information can be stored. In the example shown in FIG. 10, a polarization P is written to the material of the storage capacitor as a result of a positive voltage V being applied. The voltage V is then returned to the value V=0, and a polarization P which differs from 0 (c.f. reference 17) is retained in the ferroelectric storage capacitor.

If, for example as a result of a spurious pulse 19, the polarization migrates from the point 17 to a point 18 and the voltage 0 is present again after the spurious pulse has decayed, the polarization does not return to the point 17, but rather migrates to a point 20 that lies below the point 17. In this way, a plurality of spurious pulses may ultimately lead to the information being lost.

The introduction of spurious pulses when a memory configuration is operating also depends on the operating concept used for the memory configuration. In particular, when using the so-called VDD/2 concept, the capacitive introduction of voltage fluctuations at a common electrode of all the ferroelectric storage capacitors, for example when the memory configuration is switched on and off, and leakage currents of blocked PN junctions lead to spurious pulses. When using the pulsed concept, in particular capacitive overcoupling of a pulsed electrode bar on unselected memory cells leads to spurious pulses. Furthermore, in the VDD/2 and pulsed concepts, charge injection and capacitive introduction of the select transistor or transfer gate cause spurious pulses. Finally, when using the NAND concept, the voltage drop at the transistors as a result of the flow of current that occurs when reading and writing a memory cell causes spurious pulses.

Two approaches attempt to solve the leakage current problem encountered in the VDD/2 concept: both are based on the charge that flows through the blocked PN junction being topped up either continuously or cyclically by the select transistor of the memory cell. However, continuously switching on the select transistors is only possible when the memory configuration is not being accessed. This is because if the memory configuration is being accessed, only one word line of the memory cell array may be active, while all the other word lines must be switched off. Therefore, after the memory has been accessed, it is then necessary for all the word lines to be switched on again, which leads to a consider rise in power consumption on account of the high capacitive load. Cyclically switching on the select transistors also has the drawback that, on account of the leakage current between the cycles, spurious pulses occur at the storage capacitors, and it is at most possible to limit the amplitude of these pulses.

An additional difficulty is that the leakage current of a blocked PN junction is not only subject to considerable fluctuations but also rises substantially as the temperature rises.

In the pulsed concept, to save on chip area and to shrink the memory configuration, generally twice as many storage capacitors are connected to a common electrode bar as are addressed during a read or write access operation. To avoid this difficulty, therefore, the base surface area of a memory cell would have to be increased considerably, but this is undesirable for cost reasons.

In the case of a NAND-like configuration of the memory cells, which can also be used in combination with the VDD/2 concept, the leakage current problem of blocked PN junctions is substantially solved. However, the finite resistance of the transistors during reading or writing of the memory cells causes spurious pulses to occur at the adjacent cells.

To avoid the information losses caused by spurious pulses, it has been proposed in German Published, Non-Prosecuted Patent Application DE 198 32 994 A1, corresponding to U.S. Patent Application Publication US 2001/0012213A1, which is commonly-owned and not a prior publication, for an additional short-circuit transistor to be provided for each storage capacitor, which transistor is able to suitably short-circuit the electrodes of the storage capacitor. By way of example, activation of the short-circuit transistor after each read or write operation allows both electrodes of the storage capacitor to be brought to the same potential via the short-circuit transistor. In this way, disadvantageous influences of spurious pulses on the polarization of the ferroelectric material, in particular the build-up of a potential difference between the electrodes of the storage capacitor, can be considerably reduced or avoided.

However, with a view to the fabrication process, it is not easy to integrate an additional transistor in a ferroelectric memory cell and, in particular, to connect both electrodes of the storage capacitor to this additional transistor. Therefore, the object of the present invention is to provide a simple and inexpensive method for fabricating ferroelectric memory cells with an additional short-circuit transistor.

SUMMARY OF THE INVENTION

It is accordingly an object of the invention to provide a method for fabricating a ferroelectric memory configuration that overcomes the hereinafore-mentioned disadvantages of the heretofore-known devices of this general type.

With the foregoing and other objects in view, there is provided, in accordance with the invention, a method for fabricating a ferroelectric memory configuration. The first step of the method is providing a substrate having a multiplicity of memory cells. Each of the memory cells have a select transistor, a short-circuit transistor, and a ferroelectric capacitor having an electrode. The select transistor and the short-circuit transistor is electrically connected to the electrode of the ferroelectric capacitor. The next step is applying an electrically insulating layer to the substrate. The next step is producing a contact hole for connecting a second electrode of the ferroelectric capacitors in the electrically insulating layer. The next step is producing contact holes for connecting the short-circuit transistors in the electrically insulating layer. The next step is filling the contact holes with electrically conductive material. The next step is connecting each of the second electrodes of the ferroelectric capacitors to the short-circuit transistors by applying and patterning an electrically conductive layer.

With the objects of the invention in view, there is also provided a further method for fabricating a ferroelectric memory configuration. The first step of the method is providing a substrate having a multiplicity of memory cells. Each of the memory cells have a select transistor, a short-circuit transistor, and a ferroelectric capacitor having a first and a second electrode. The select transistor and the short-circuit transistor are connected to the first electrode of the ferroelectric capacitor. The next step is applying a first electrically insulating layer to the substrate. The next step is producing recesses in the first electrically insulating layer. The recesses reach the second electrodes of the ferroelectric capacitors. The next step is producing contact holes for connecting the short-circuit transistors with the contact holes and the recesses overlapping one another. The next step is conductively connecting each of the second electrodes of the ferroelectric capacitors to the short-circuit transistors by filling the contact holes and the recesses with electrically conductive material.

The invention provides a method for fabricating a ferroelectric memory configuration, including the following steps:

a) a substrate having a multiplicity of memory cells, which each have at least one select transistor, at least one short-circuit transistor and at least one ferroelectric capacitor, and in which the transistors are connected in an electrically conductive manner to a first of the electrodes of the ferroelectric capacitor, is provided;

b) at least one electrically insulating layer is applied;

c) at least one contact hole for connecting the second electrodes of the ferroelectric capacitors is produced;

d) contact holes for connecting the short-circuit transistors are produced;

e) the contact holes are filled with electrically conductive material; and f) an electrically conductive layer is applied and patterned, so that the second electrodes of the ferroelectric capacitors are each conductively connected to the short-circuit transistors.

The method according to the invention has the advantage that it can be integrated without problems into an existing process sequence used for the fabrication of a ferroelectric memory cell without an additional short-circuit transistor. Therefore, numerous process parameters can be transferred without major changes, allowing inexpensive production.

It is preferable if, before step e), contact holes for connecting the select transistors are produced. Furthermore, it is preferable if the contact holes for connecting the select transistors are produced at the same time as contact holes for connecting the short-circuit transistors. In this way, there is no need for an additional mask level for producing the contact holes for connecting the short-circuit transistors.

According to a preferred embodiment, the conductive layer from step f) is patterned in such a way that bit lines are additionally produced. The conductive layer, via which the second electrode is connected to the short-circuit transistor, therefore corresponds to the first metalization level, which is usually used to transport electric charges from and to the memory cells. In this embodiment of the present invention, it is therefore possible to produce the connection between the electrodes via the short-circuit transistor, without having to use an additional conductive layer. Accordingly, there is no need for any additional mask levels compared to the conventional procedure.

Furthermore, the invention provides a method for fabricating a ferroelectric memory configuration, including the following steps:

a) a substrate having a multiplicity of memory cells, which each have at least one select transistor, at least one short-circuit transistor and at least one ferroelectric capacitor, and in which the transistors are connected to a first of the electrodes of the ferroelectric capacitor, is provided;

b) at least one first electrically insulating layer is applied;

c) recesses leading down to the second electrodes of the ferroelectric capacitors are produced in the first electrically insulating layer;

d) contact holes for connecting the short-circuit transistors are produced, the contact holes and the recesses overlapping one another;

e) the contact holes and the recesses are filled with electrically conductive material, so that the second electrodes of the ferroelectric capacitors are in each case conductively connected to the short-circuit transistors.

This inventive method also has the advantage that it can be integrated without difficulties into an existing process sequence used for the fabrication of a ferroelectric memory cell without an additional short-circuit transistor. Therefore, numerous process parameters can be transferred without major changes, allowing inexpensive production.

In this case, it is preferable, if before step e), contact holes for connecting the select transistors are produced. Furthermore, it is preferable if the contact holes for connecting the select transistors are produced at the same time as contact holes for connecting the short-circuit transistors. In this way, there is no need for an additional mask level for producing the contact holes for connecting the short-circuit transistors.

According to a preferred embodiment, at least one contact hole for connecting the second electrodes of the ferroelectric capacitors is produced. In this embodiment, it is particularly preferred if the at least one contact hole for connecting the second electrodes of the ferroelectric capacitors is produced at the same time as the recesses. In this way, there is also no need for an additional mask level in order to produce the recess.

Furthermore, it is preferable if a second electrically insulating layer is applied. In this way, in particular the electrically conductive connection between the second electrode of the ferroelectric capacitor and the short-circuit transistor can be reliably insulated from the remaining memory configuration.

Accordingly, it is also preferable if contact holes for connecting the select transistors are produced in the second electrically insulating layer, and it is particularly preferable if an electrically conductive layer is then deposited and patterned, so that the contact holes in the second electrically insulating layer are filled and the bit lines are produced. In this way, it is possible to eliminate a step of prior filling of the contact holes in the second electrically insulating layer, which once again has a positive effect on the process costs.

According to a preferred embodiment, the contact holes for connecting the short-circuit transistors are produced all the way down to the diffusion regions of the short-circuit transistors in the substrate. According to a further preferred embodiment, the contact holes for connecting the short-circuit transistors are produced all the way down to electrically conductive plugs, which are connected in an electrically conductive manner to the diffusion regions of the short-circuit transistors in the substrate.

Furthermore, it is preferable if tungsten is used to fill the contact holes and/or the recesses.

Furthermore, it is particularly preferable if field-effect transistors of the depletion type are used as short-circuit transistors. A transistor of the depletion type is particularly advantageous, because it provides effective protection for the ferroelectric storage capacitor both in the active operating state and in the disconnected state, in the form of a Faraday cage. Moreover, if the threshold voltage is selected appropriately, it is possible to ensure that the memory configuration does not require any additional surface area compared to an 1T1C (1 transistor, 1 capacitor) memory cell.

Other features that are considered as characteristic for the invention are set forth in the appended claims.

Although the invention is illustrated and described herein as embodied in method for fabricating a ferroelectric memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
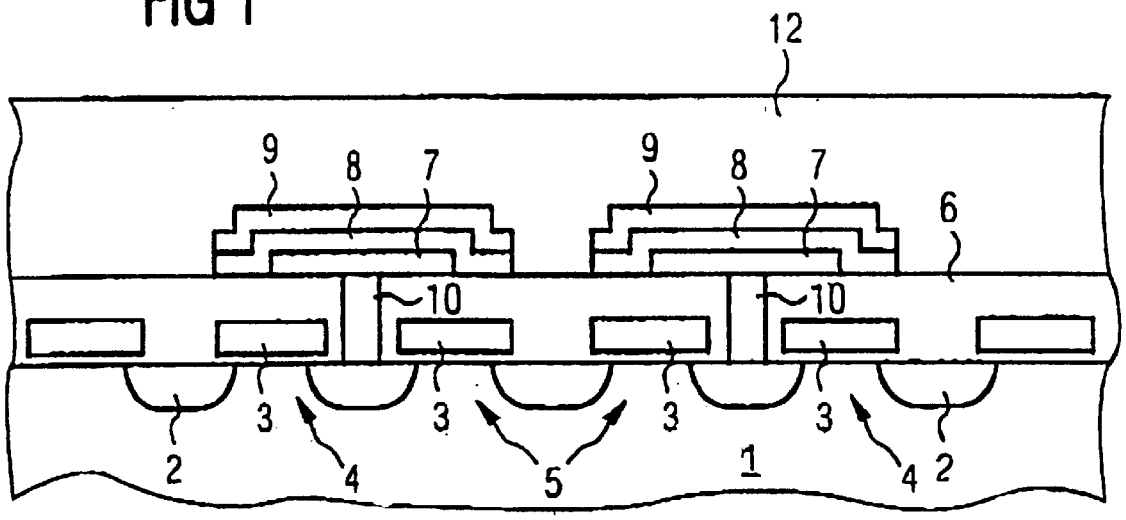
FIGS. 1–4 are sectional views showing a first embodiment of a method for fabricating ferroelectric memory cells.
Figure 2:
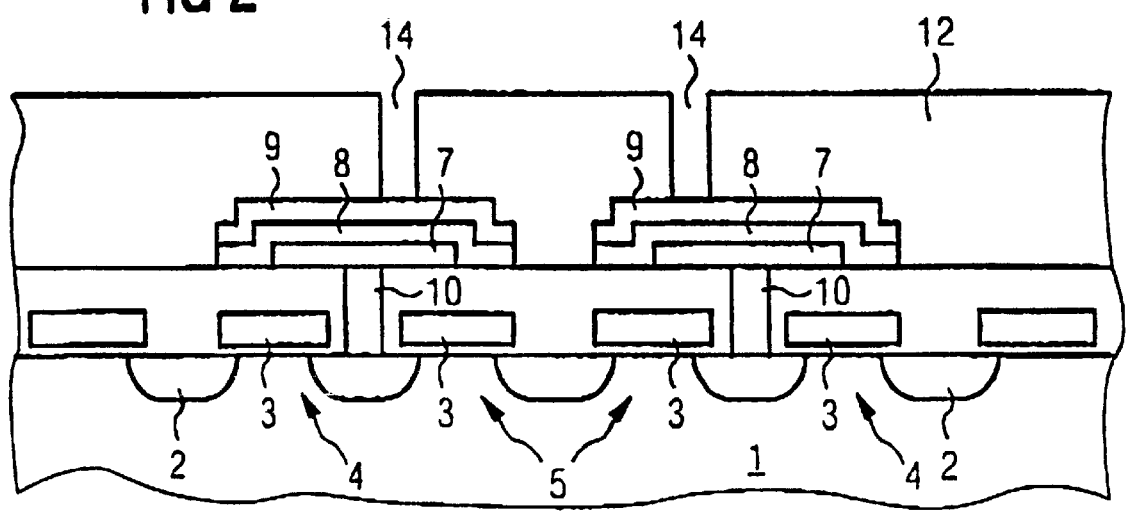

Referring now to the figures of the drawings in detail and first, particularly to FIG. 1 thereof, there is shown a starting point for a method for fabricating a ferroelectric memory configuration in accordance with a first exemplary embodiment of the invention. A semiconductor substrate 1, usually silicon, with diffusion regions 2 disposed therein is provided. The diffusion regions 2, together with the gate tracks 3, form the select transistors 4 and the short-circuit transistors 5. In this example, the select transistors 4 and the short-circuit transistors 5 each use one common diffusion region 2, in order to minimize the space required by a memory cell. To electrically insulate the gate tracks 3 from one another, the gate tracks 3 are surrounded by insulating material 6.

The ferroelectric storage capacitors, which are composed of a first electrode 7, the ferroelectric material 8 and a second electrode 9, are disposed on the insulating material 6. The select transistors 4 and the short-circuit transistors 5 of each memory cell are in each case connected in an electrically conductive manner, via a plug 10, to the first electrodes 7 of the ferroelectric storage capacitor.

Then, an insulating layer 12 is applied to the upper electrode 9. The insulating layer used may, for example, be a $SiO_2$ layer that is deposited using a CVD method. Then, the insulating layer is planarized, in order to obtain a surface that is as planar as possible. The resulting situation is shown in FIG. 1.

Then, a photographic technique is used to produce contact holes 14 for connecting the-second electrodes 9 of the ferroelectric capacitors in the insulating layer 12. If the second electrodes 9 of the ferroelectric capacitors are connected to one another in an electrically conductive manner, there is no need to produce a contact hole 14 for each memory cell.

Figure 3:
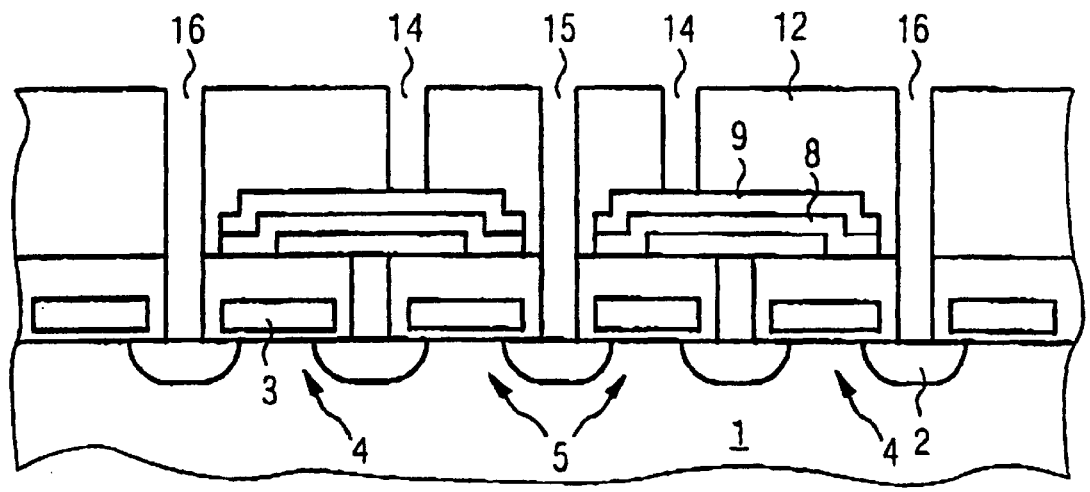

Then, a photographic technique is once again used to produce the contact holes 15 for connecting the short-circuit transistors 5 and the contact holes 16 for connecting the select transistors 4. Because the contact holes 16 for connecting the select transistors 4 are produced at the same time as contact holes 15 for connecting the short-circuit transistors 5, there is no need for an additional mask level in order to produce the contact holes 15 for connecting the short-circuit transistors 5. The resulting situation is shown in FIG. 3.

Figure 4:
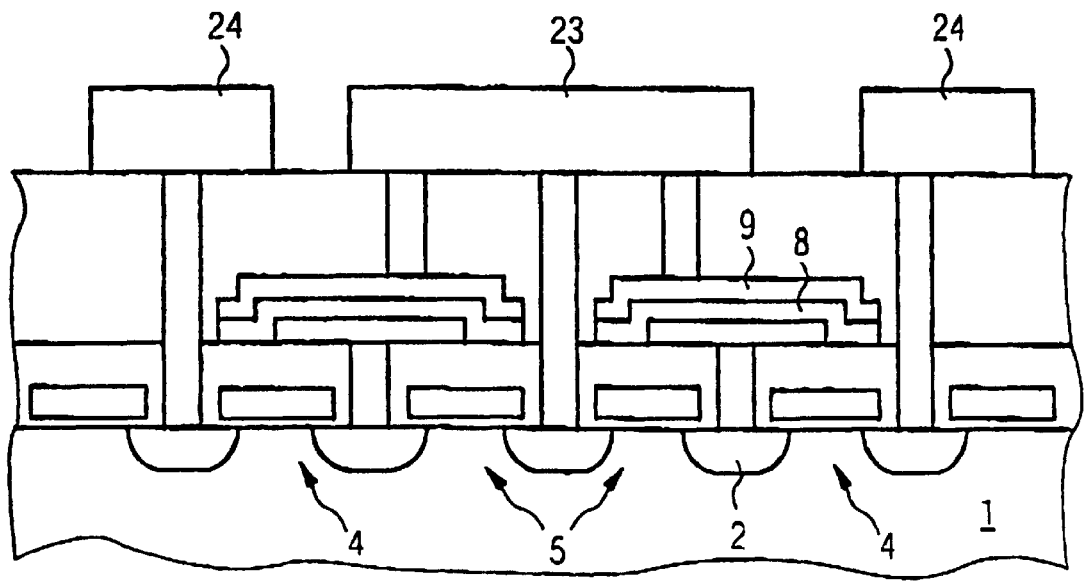

The contact holes 14, 15 and 16 are then filled with an electrically conductive material, such as tungsten. To avoid undesirable tungsten/silicon reactions, a thin Ti/TiN film (not shown) is used as contact and barrier layer between the silicon and the tungsten. The deposition of tungsten is followed by a CMP (Chemical Mechanical Polishing) step, in To order once again to obtain a surface that is as planar as possible. Then, an electrically conductive layer, for example an aluminum layer, is applied and is patterned with the aid of a photographic technique. In this way, electrically conductive connections 23 are produced between in each case the contact hole 15 for connecting the second electrodes 9 and the contact hole 15 for connecting the short-circuit transistors 5. At the same time, the bit lines 24, which carry to the storage capacitors the charges required to read or write the information, are produced. The resulting situation is shown in FIG. 4.

Figure 5:
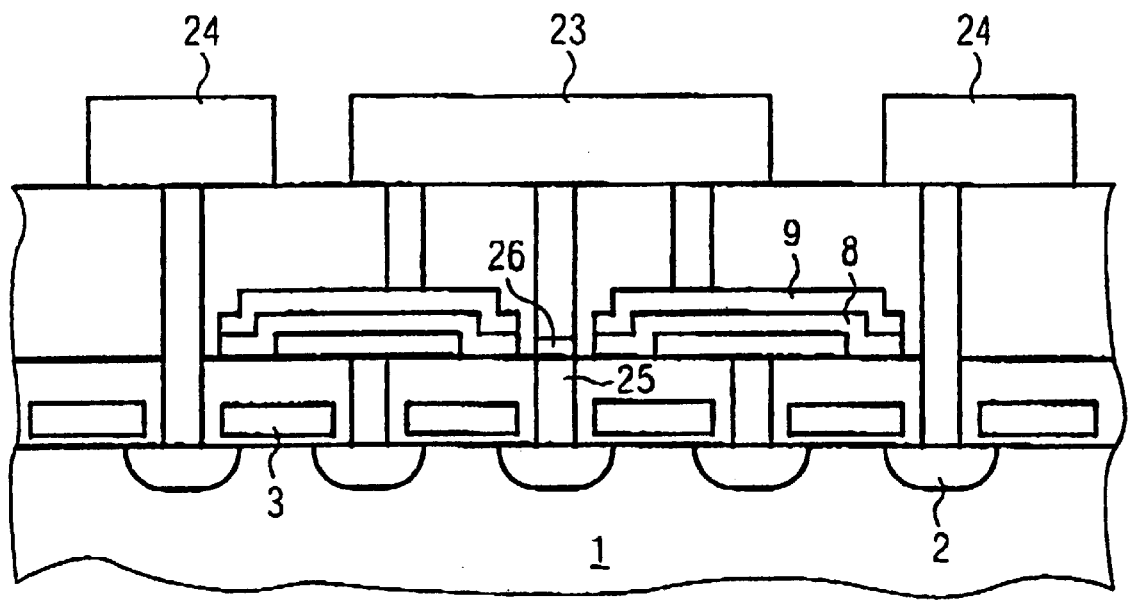
FIG. 5 is a sectional view showing a further embodiment a ferroelectric memory cell made according to the first embodiment of the method shown in FIGS. 1 to 4.

In the embodiment of the present invention which is described in FIGS. 1 to 4, the contact holes 15 for connecting the short-circuit transistors 5 are produced all the way down to the diffusion regions 2 of the short-circuit transistors 5 in the silicon substrate. As an alternative, it is possible for the contact holes 15 for connecting the short-circuit transistors 5 to be produced all the way down to electrically conductive plugs 25, which are connected in an electrically conductive manner to the diffusion regions 2 of the short-circuit transistors 5 in the silicon substrate. In this case, one or more layers can be provided between the contact holes and the plugs 25, which layers are patterned to form landing pads. FIG. 5 shows the result of a method of this type, in which part of the layer that was used to produce the first/second electrode is used as landing pad 26.

Figure 6:
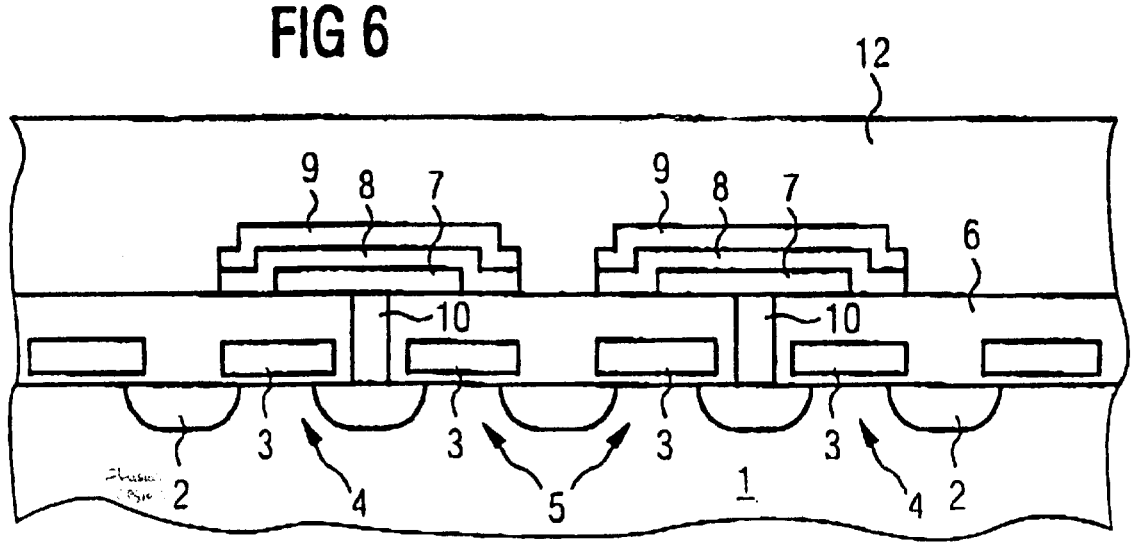
FIGS. 6–9 are sectional views showing a further embodiment of a method for fabricating ferroelectric memory cells.
Figure 7:
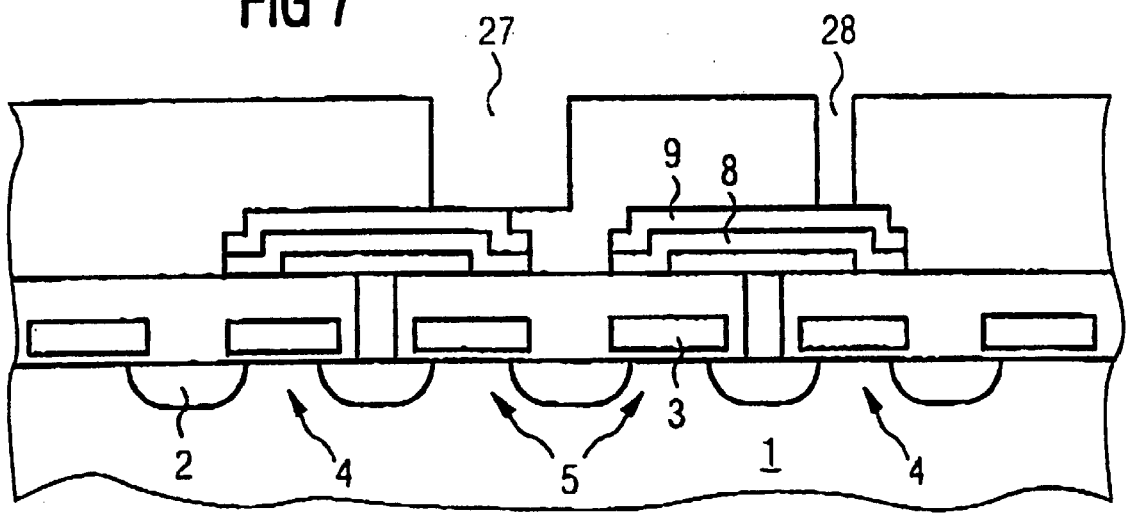

FIG. 6 shows a starting point for a method for fabricating a ferroelectric memory configuration in accordance with a second exemplary embodiment of the invention. A semiconductor substrate 1, usually of silicon, with diffusion regions 2 disposed therein is provided. The diffusion regions 2, together with the gate tracks 3, form the select transistors 4 and the short-circuit transistors 5. In this example, the select transistors 4 and the short-circuit transistors 5 use a joint diffusion region 2, in order to minimize the space required for a memory cell. To insulate the gate tracks 3 from one another, the gate tracks 3 are surrounded by insulating material 6.

The ferroelectric storage capacitors, which are composed of a first electrode 7, the ferroelectric material 8 and a second electrode 9, are disposed on the insulating material 6. The select transistors 4 and the short-circuit transistors 5 of each memory cell are in each case connected in an electrically conductive manner, via a plug 10, to the first electrode of the ferroelectric storage capacitor.

Then, a first insulating layer 12 is applied to the upper electrode 9. The insulating layer used may, for example, be a $SiO_2$ layer, which is deposited using a CVD method. Then, the first insulating layer 12 is planarized, in order to obtain a surface that is as planar as possible.

Then, recesses 27 leading all the way down to the second electrodes 9 of the ferroelectric capacitors are produced in the first electrically insulating layer 12. Furthermore, the contact hole 28 for connecting the second electrodes 9 of the ferroelectric capacitors is produced at the same time as the recesses. In this way, there is no need for an additional mask level in order to produce the recess 27, since the contact holes 28 are provided at this point in the process sequence when using conventional fabrication methods.

Figure 8:
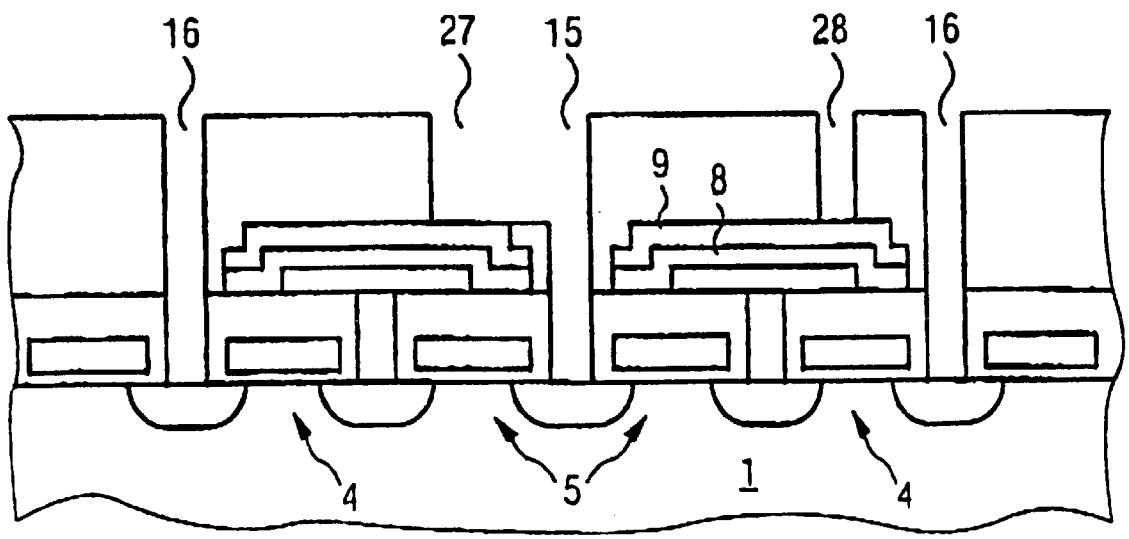

Then, the contact holes 16 for connecting the select transistors 4 and the contact holes 15 for connecting the short-circuit transistors 5 are produced. Once again, these different contact holes 15, 16 are produced simultaneously. In this way, there is no need for an additional mask level in order to produce the contact holes 15 for connecting the short-circuit transistors 5. The contact holes 15 for connecting the short-circuit transistors 5 are produced in such a way that the contact holes 15 and the recesses 27 overlap one another. This means that during the subsequent filling of the contact holes and the recesses, a conductive connection between the recess 27 and the contact hole 15 is formed directly, without further patterning. The resulting situation is shown in FIG. 8.

Then, the contact holes 14, 15, and 16 and the recess 27 are filled with an electrically conductive material, such as tungsten. To avoid undesirable tungsten/silicon reactions, a thin Ti/TiN film (not shown) is used as contact and barrier layer between the silicon and the tungsten. The tungsten deposition is followed by a CMP (Chemical Mechanical Polishing) step, in order once again to obtain a surface that is as planar as possible.

Then, a second electrically insulating layer 30, for example a $SiO_2$ layer, is applied. As a result, the electrically conductive connection (recess 27 and contact hole 15 filled with tungsten) between the second electrode 9 of the ferroelectric capacitor and the short-circuit transistor 5 is electrically insulated from the remainder of the memory configuration. The thickness of this layer 30 is approximately between 200 and 400 nm.

Then, a photographic technique is used to produce contact holes 31 for connecting the select transistors 4 in the second electrically insulating layer 30. This is followed by application of an electrically conductive layer, for example an aluminum layer, which is likewise patterned with the aid of a photographic technique, so that the bit lines 24 are produced. On account of the relatively low thickness of the layer 30 (approximately 200 to 400 nm), the contact holes 31 in the second electrically insulating layer 30 are filled at the same time as the application of the conductive layer. In this way, it is possible to dispense with prior filling of the contact holes 31 in the second electrically insulating layer 30, which once again has positive effects on the process costs. The resulting situation is shown in FIG. 9.

Figure 9:
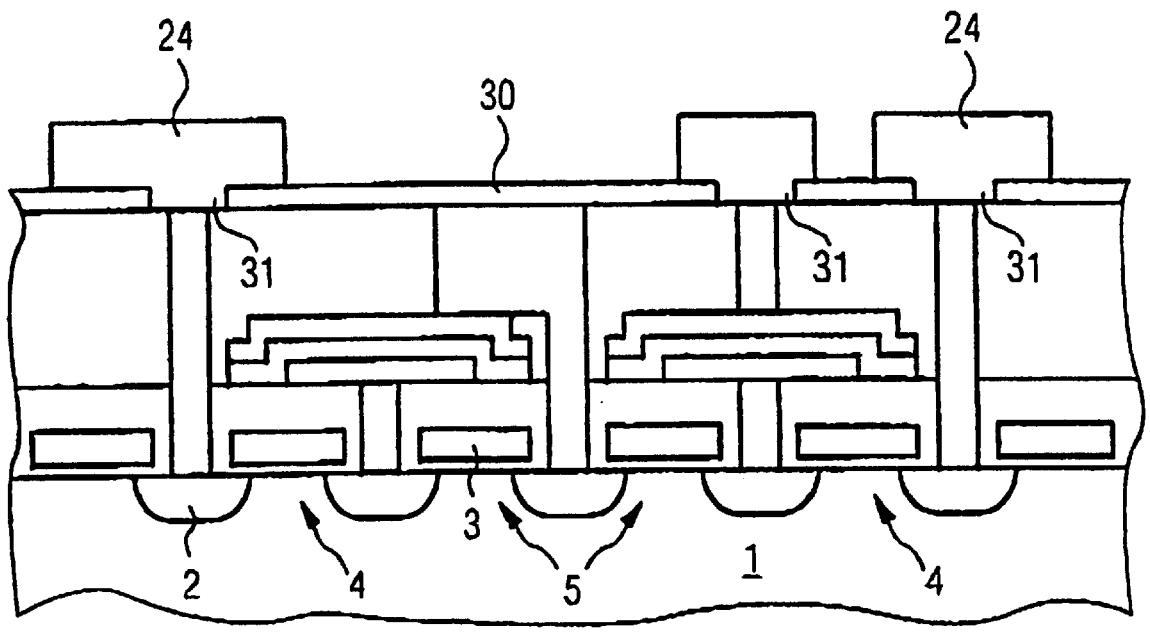
Figure 10:
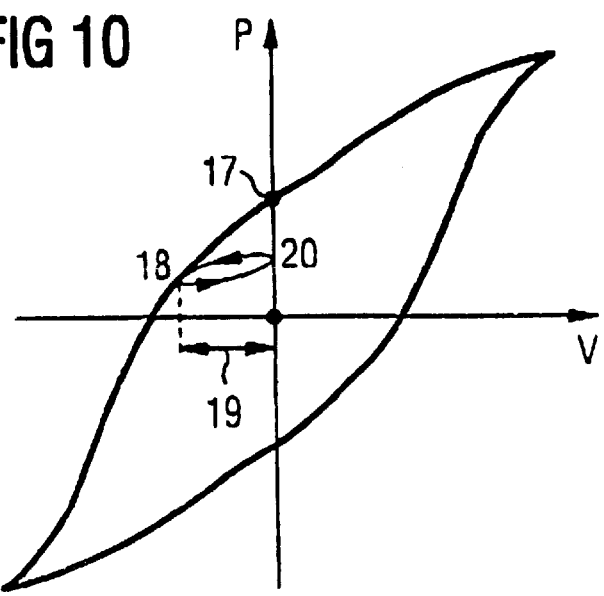
FIG. 10 is a graph showing a hysteresis curve for a ferroelectric memory.

In the example shown in FIG. 9, the second electrodes 9 of adjacent memory cells are connected to one another in an electrically conductive manner (not shown). Therefore, it is sufficient for the recess 27 to be disposed only above the upper electrode 9 on the left in FIG. 9. The electrically conductive connection between the second electrodes 9 ensures that the upper electrode on the right in FIG. 9 is also connected in an electrically conductive manner to the short-circuit transistor 5 disposed directly beneath it, via the recess 27 and the contact hole 15.

We claim:

1. A method for fabricating a ferroelectric memory configuration, which comprises:

providing a substrate having a multiplicity of memory cells, each of the memory cells having a select transistor, a short-circuit transistor, and a ferroelectric capacitor having a first and a second electrode, the select transistor and the short-circuit transistor being electrically connected to the first electrode of the ferroelectric capacitor;

applying an electrically insulating layer to the substrate;

producing a contact hole in the electrically insulating layer for connecting the second electrode of the ferroelectric capacitor;

producing contact holes in the electrically insulating layer for connecting the short-circuit transistors;

filling the contact holes with electrically conductive material; and connecting each of the second electrodes of the ferroelectric capacitors to the short-circuit transistors by applying and patterning an electrically conductive layer.

2. The method according to claim 1, which further comprises producing contact holes in the electrically insulating layer for connecting the select transistors before filling the contact holes.

3. The method according to claim 2, which further comprises producing the contact holes for connecting the select transistors simultaneously with the contact holes for connecting the short-circuit transistors.

4. The method according to claim 1, which further comprises producing additionally bit lines during the patterning of the conductive layer.

5. The method according to claim 1, which further comprises producing the contact holes for connecting the short-circuit transistors all the way down to the diffusion regions of the short-circuit transistors in the substrate.

6. The method according to claim 1, which further comprises producing the con tact holes for connecting the short-circuit transistors all the way down to electrically conductive plugs, the electrically conductive plugs being electrically connected to the diffusion regions of the short-circuit transistors (5) in the substrate.

7. The method according to claim 1, which further comprises filling at least one of the contact holes and the recesses with tungsten.

8. The method according to claim 1, which further comprises using field-effect transistors of the depletion type as short-circuit transistors.

9. A method for fabricating a ferroelectric memory configuration, which comprises:

providing a substrate having a multiplicity of memory cells, each memory cell having a select transistor, a short-circuit transistor, and a ferroelectric capacitor having a first and a second electrode, the select transistor and the short-circuit transistor being connected to the first electrode of the ferroelectric capacitor;

applying a first electrically insulating layer to the substrate;

producing recesses in the first electrically insulating layer, the recesses reaching the second electrodes of the ferroelectric capacitors;

producing contact holes for connecting the short-circuit transistors, the contact holes and the recesses overlapping one another;

conductively connecting each of the second electrodes of the ferroelectric capacitors to the short-circuit transistors by filling the contact holes and the recesses with electrically conductive material.

10. The method according to claim 9, which further comprises producing contact holes for connecting the select transistors before filling the contact holes and the recesses.

11. The method according to claim 10, which further comprises producing the contact holes for connecting the select transistors simultaneously with the contact holes for connecting the short-circuit transistors.

12. The method according to claim 9, which further comprises producing a contact hole for connecting the second electrodes of the ferroelectric capacitors.

13. The method according to claim 12, which further comprises producing the contact hole for connecting the second electrodes of the ferroelectric capacitors simultaneously with the recesses.

14. The method according to claim 9, which further comprises applying a second electrically insulating layer to the first electrically insulating layer.

15. The method according to claim 14, which further comprises producing contact holes for connecting the select transistors in the second electrically insulating layer.

16. The method according to claim 15, which further comprises filling the contact holes in the second electrically insulating layer and producing bit lines by depositing and patterning an electrically conductive layer.

17. The method according to claim 9, which further comprises producing the contact holes for connecting the short-circuit transistors all the way down to the diffusion regions of the short-circuit transistors in the substrate.

18. The method according to claim 9, which further comprises producing the contact holes for connecting the short-circuit transistors all the way down to electrically conductive plugs, the electrically conductive plugs being electrically connected to the diffusion regions of the short-circuit transistors in the substrate.

19. The method according to claim 9, which further comprises filling at least one of the contact holes and the recesses with tungsten.

20. The method according to claim 9, which further comprises using field-effect transistors of the depletion type as short-circuit transistors.

* * * * *